United States Patent
Akiyama

(10) Patent No.: US 10,951,106 B2
(45) Date of Patent: Mar. 16, 2021

(54) SEMICONDUCTOR DEVICE

(71) Applicant: DENSO CORPORATION, Kariya (JP)

(72) Inventor: Hironori Akiyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 119 days.

(21) Appl. No.: 16/293,834

(22) Filed: Mar. 6, 2019

(65) Prior Publication Data

US 2019/0199195 A1    Jun. 27, 2019

Related U.S. Application Data

(63) Continuation of application No. PCT/JP2017/027376, filed on Jul. 28, 2017.

(30) Foreign Application Priority Data

Sep. 23, 2016  (JP) .............................. JP2016-185851

(51) Int. Cl.
| | | |
|---|---|---|
| *H01L 23/34* | (2006.01) | |
| *H01L 25/07* | (2006.01) | |
| *H02M 1/08* | (2006.01) | |
| *H02M 7/5387* | (2007.01) | |
| *H03K 17/567* | (2006.01) | |
| *H03K 17/12* | (2006.01) | |
| *H02M 1/088* | (2006.01) | |
| *H02M 7/00* | (2006.01) | |

(Continued)

(52) U.S. Cl.
CPC ............ *H02M 1/08* (2013.01); *H01L 25/072* (2013.01); *H02M 1/088* (2013.01); *H03K 17/12* (2013.01); *H03K 17/567* (2013.01); *H01L 23/34* (2013.01); *H01L 23/4334* (2013.01); *H01L 2224/06181* (2013.01); *H01L 2224/32245* (2013.01); *H01L 2224/33181* (2013.01); *H02M 7/003* (2013.01); *H02M 7/5387* (2013.01); *H02M 2001/327* (2013.01); *H02P 27/06* (2013.01)

(58) Field of Classification Search
USPC ........................................................ 307/117
See application file for complete search history.

(56) References Cited

U.S. PATENT DOCUMENTS

2003/0022464 A1* 1/2003 Hirano .................. H01L 21/565
                                                          438/460
2004/0252430 A1* 12/2004 Oumaru ............. H03K 17/0828
                                                          361/84

(Continued)

FOREIGN PATENT DOCUMENTS

| JP | 2005-287227 A | 10/2005 |
| JP | 2014-233127 A | 12/2014 |
| JP | 2016-046424 A | 4/2016 |

*Primary Examiner* — Rexford N Barnie
*Assistant Examiner* — Xuan Ly
(74) *Attorney, Agent, or Firm* — Posz Law Group, PLC

(57) ABSTRACT

A semiconductor device includes a plurality of switching elements electrically connected in parallel with each other, a control unit that outputs a control signal for controlling a current supplied to each of the switching elements, and a temperature estimation unit that estimates a temperature difference between the switching elements. When an estimated temperature difference becomes equal to or higher than a predetermined threshold temperature, the control unit shifts an operation mode to a stop mode for stopping driving of a switching element having a temperature higher than the other.

13 Claims, 7 Drawing Sheets

(51) Int. Cl.
   *H01L 23/433*    (2006.01)
   *H02M 1/32*      (2007.01)
   *H02P 27/06*     (2006.01)

(56) References Cited

U.S. PATENT DOCUMENTS

2013/0002227 A1\* 1/2013 Ikeda .................. H02M 7/5387
                                                        323/311
2013/0155745 A1\* 6/2013 Tanaka ................. H02M 7/003
                                                        363/131
2014/0223949 A1\* 8/2014 Sakae .................... H02M 7/23
                                                        62/324.1

\* cited by examiner

SEMICONDUCTOR DEVICE

CROSS REFERENCE TO RELATED APPLICATIONS

The present application is a continuation application of International Patent Application No. PCT/JP2017/027376 filed on Jul. 28, 2017, which designated the U.S. and claims the benefit of priority from Japanese Patent Application No. 2016-185851 filed on Sep. 23, 2016. The entire disclosures of all of the above applications are incorporated herein by reference.

TECHNICAL FIELD

The present disclosure relates to a semiconductor device for controlling switching elements connected in parallel.

BACKGROUND

In a semiconductor device that allows a relatively large current, which cannot be driven by one power switching element, a technique of driving power switching elements connected in parallel to each other has been employed. However, in the power switching elements connected in parallel to each other, even if the element types are different or the element types are the same, a larger current may flow into one of the power switching elements than the other power switching element due to a difference in threshold voltage or on-resistance.

SUMMARY

The present disclosure provides a semiconductor device having a plurality of switching elements, and being capable of reducing a temperature difference between the plurality of switching elements with a simple structure.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
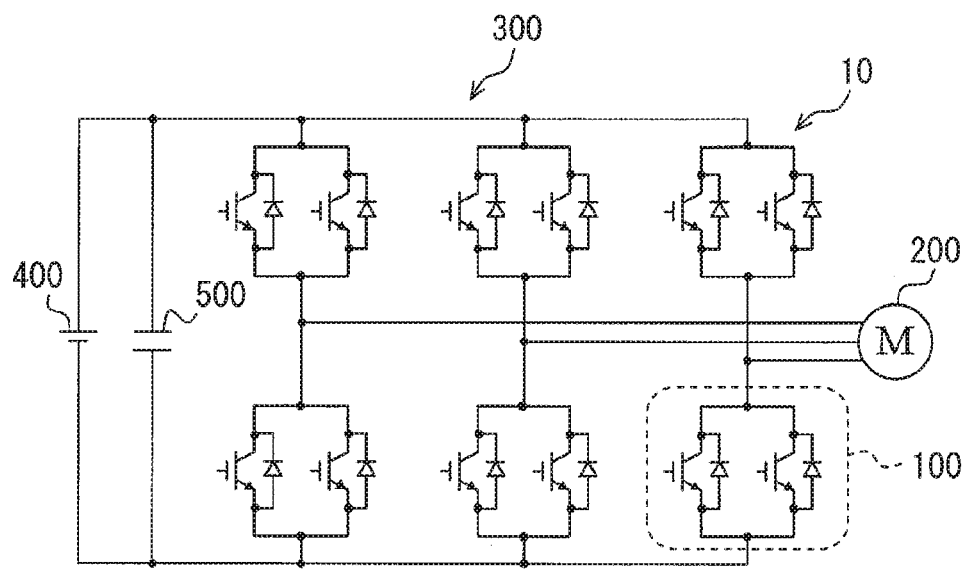
FIG. 1 is a circuit diagram showing a schematic configuration of a semiconductor device according to a first embodiment.

In a semiconductor device in which power switching elements are connected in parallel to each other, even if the element types are different or the element types are the same, a larger current may flow into one of the power switching elements than the other power switching element due to a difference in threshold voltage or on-resistance. This causes a difference in the heat generation amount between the power switching elements connected in parallel. For that reason, in the semiconductor device as a whole, a use range of the power switching element having a larger heat generation amount may be rate-limited.

Further, there is a semiconductor device in which, when a temperature difference between plural semiconductor elements (power switching elements) is detected, a current to be supplied to a semiconductor element having a higher temperature is reduced and a current to be supplied to a semiconductor element having a lower temperature is increased.

In such a semiconductor device, a voltage of a control signal is changed in an analog manner in accordance with a temperature difference between the plural semiconductor elements. Even if the temperature difference is changed slightly, there is a need to increase or decrease a current to be supplied to the semiconductor element in response to the change in the temperature difference under control. In other words, a circuit for outputting the control signal to a control terminal of the semiconductor device may become complicated and increased in scale.

According to an aspect of the present disclosure, a semiconductor device includes: a plurality of switching elements that are electrically connected in parallel with each other; a control unit that is configured to output a control signal for controlling a current supplied to each of the plurality of switching elements; and a temperature estimation unit that is configured to estimate a temperature difference between the plurality of switching elements. The control unit is configured to shift an operation mode to a stop mode that stops driving of at least one of the plurality of switching elements, which has a temperature higher than the other, in response to the estimated temperature difference being equal to or higher than a predetermined threshold temperature.

According to the above configuration, when a temperature difference of a predetermined value or more occurs between the switching elements, the driving of the switching element that is higher in temperature than the other is stopped. This makes it possible to simplify the circuit configuration of the control unit as compared with the configuration in which the current to be supplied to the semiconductor device is adjusted in an analog manner, that is, continuously. Therefore, an increase in scale due to the complexity of the circuit can be reduced.

Since the semiconductor device stops the switching element that is higher in temperature than the other when the temperature difference becomes equal to or greater than a predetermined threshold value, the processing involved in the feedback can be reduced as compared with the configuration in which adjustment is required even when only a slight temperature difference occurs.

Embodiments of the present disclosure will be described below with reference to the drawings. The same reference numerals are assigned to the same or equivalent parts in the following descriptions and drawings.

First Embodiment

First, a schematic configuration of a semiconductor device according to the present embodiment will be described with reference to FIGS. 1 and 2.

As shown in FIG. 1, a semiconductor device 100 according to the present embodiment includes switching elements providing an inverter circuit 300 and a controller for controlling the switching elements in a power conversion apparatus for driving a motor 200 mounted on a vehicle, for example.

The inverter circuit 300 is inserted between the motor 200 as a load and a power supply 400, and converts a DC power into an AC power. A smoothing capacitor 500 is interposed between the inverter circuit 300 and the power supply 400.

The inverter circuit 300 constitutes a three-phase AC inverter. The switching elements 10 are connected in series between a positive electrode and a negative electrode of the power supply 400, and the motor is connected to a middle point between the switching elements 10 connected in series, to thereby form one phase. Three of such configurations are connected in parallel with each other to form three phases. The semiconductor device 100 includes the switching elements 10 and the controller for controlling the switching elements 10.

Figure 2:
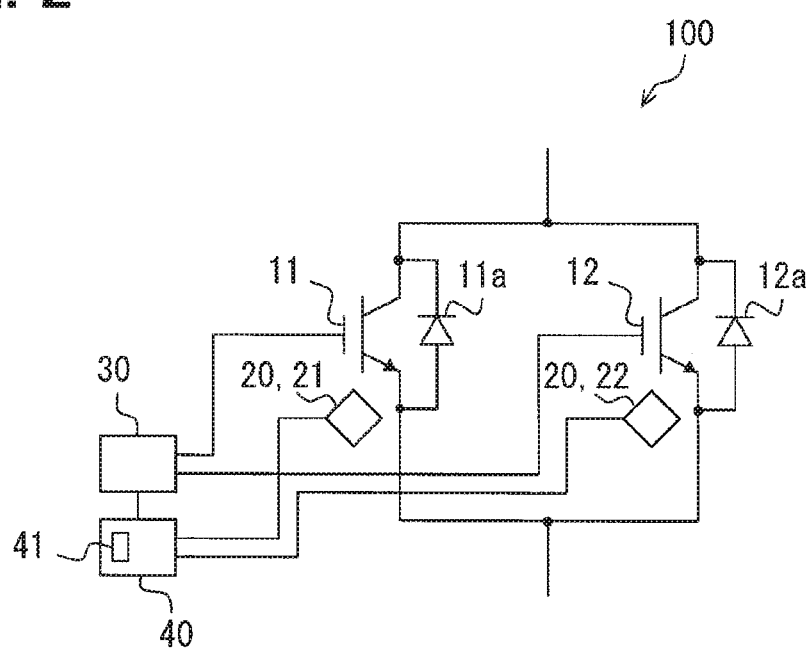
FIG. 2 is a block diagram showing a detailed configuration of the semiconductor device.

As shown in FIG. 2, the semiconductor device 100 includes two elements 11 and 12 electrically connected in parallel with each other as the switching elements 10. Specifically, the semiconductor device 100 includes the first element 11 and the second element 12. Each of the switching elements 10 of the present embodiment is configured by an insulated gate bipolar transistor (IGBT). The first element 11 and the second element 12 include free-wheeling diodes 11a and 12a, respectively. The first element 11 and the second element are the same elements in terms of specifications.

A control unit 30 that outputs a control signal as a gate drive signal is connected to a gate terminal of the first element 11 and a gate terminal of the second element 12, as the controller. The control unit 30 applies a gate voltage to the gate terminal to turn on the switching element 10. In the present embodiment, the control unit 30 applies the gate voltage so as to repeat an ON period and an OFF period of a voltage application in a predetermined cycle. A state in which the switching element 10 is driven in the same cycle is a normally driven state. The driving of the switching element 10 is stopped in the case of only the OFF period with the elimination of the ON period of the voltage application.

A first temperature sensor 21 for detecting a temperature of the first element 11 is provided in the vicinity of the first element 11, and a second temperature sensor 22 for detecting a temperature of the second element 12 is provided in the vicinity of the second element 12. The first temperature sensor 21 and the second temperature sensor 22 directly detect temperatures of the switching elements 10. The first temperature sensor 21 and the second temperature sensor 22 correspond to a direct temperature detection unit. Hereinafter, the two temperature sensors may be collectively referred to as a temperature sensor 20.

The temperature sensor 20 is connected to a temperature estimation unit 40. The temperature estimation unit 40 has a calculation unit 41 that calculates, based on a temperature T1 of the first element 11 detected by the first temperature sensor 21 and a temperature T2 of the second element 12 detected by the second temperature sensor 22, a temperature difference $\Delta T = |T2-T1|$ between the temperatures of the first element 11 and the second element 12. The temperature difference $\Delta T$ is estimated by the temperature estimation unit 40, and the control unit 30 switches an operation mode of the switching elements 10 based on the temperature difference $\Delta T$.

Next, an implementation of the semiconductor device 100 will be described with reference to FIG. 3.

Each of the first element 11 and the second element 12 is disposed so as to be sandwiched between a pair of metal bodies 51 and 52. For example, the first element 11 and the second element 12 are mounted on the metal body 51 so that collector electrodes of the first element 11 and the second element 12 are electrically connected to the metal body 51. The metal body 52 sandwiches the first element 11 and the second element 12 with the metal body 51 so as to be electrically connected to emitter electrodes of the first element 11 and the second element 12. As a result, the metal body 51 serves as a collector electrode plate shared with the two elements 11 and 12, and similarly, the metal body 52 serves as an emitter electrode plate shared with the two elements 11 and 12.

The first element 11 is electrically connected to the metal body 52 through a spacer 53, and the second element 12 is electrically connected to the metal body 52 through a spacer 54. The first element 11 and the spacer 53, the second element 12 and the spacer 54, the elements 11 and 12 and the metal body 51, and the spacers 53 and 54 and the metal body 52 are bonded to each other by a conductive adhesive 55 such as solder.

The elements 11 and 12, the spacers 53 and 54, and the metal bodies 51 and 52 are sealed and protected with a resin 56. One surface of the metal body 51 with which the elements 11 and 12 are not in contact is exposed to the outside from the sealing resin. Similarly, one surface of the metal body 52 with which the spacers 53 and 54 are not in contact is exposed to the outside from the sealing resin. The surfaces of the metal bodies 51 and 52 exposed to the outside are used for electrical contact with the outside, and function as heat radiation surfaces.

The switching to the operation mode by the above-described control unit 30 will be described below with reference to FIG. 4.

As described above, the control unit 30 outputs the control signal for repeating the ON period and the OFF period in the predetermined cycle to both of the first element 11 and the second element 12, thereby causing the currents to flow through the first element 11 and the second element 12. This state is referred to as a normal mode. FIG. 4 is a timing chart showing a certain time point in the normal mode as a time t=0. The temperature difference shown in FIG. 4 indicates T2−T1 and is not the temperature difference $\Delta T$ as an absolute value.

At the time t=0, the normal mode is continuing. As a time elapses from the time t=0, although the first element 11 is maintained at a substantially constant temperature, the temperature of the second element 12 increases. Various causes of the temperature increase of the second element 12 are assumed. For example, it is conceivable that one cause resides in that the on-resistance of the second element 12 may be larger than that of the first element 11.

Figure 4:
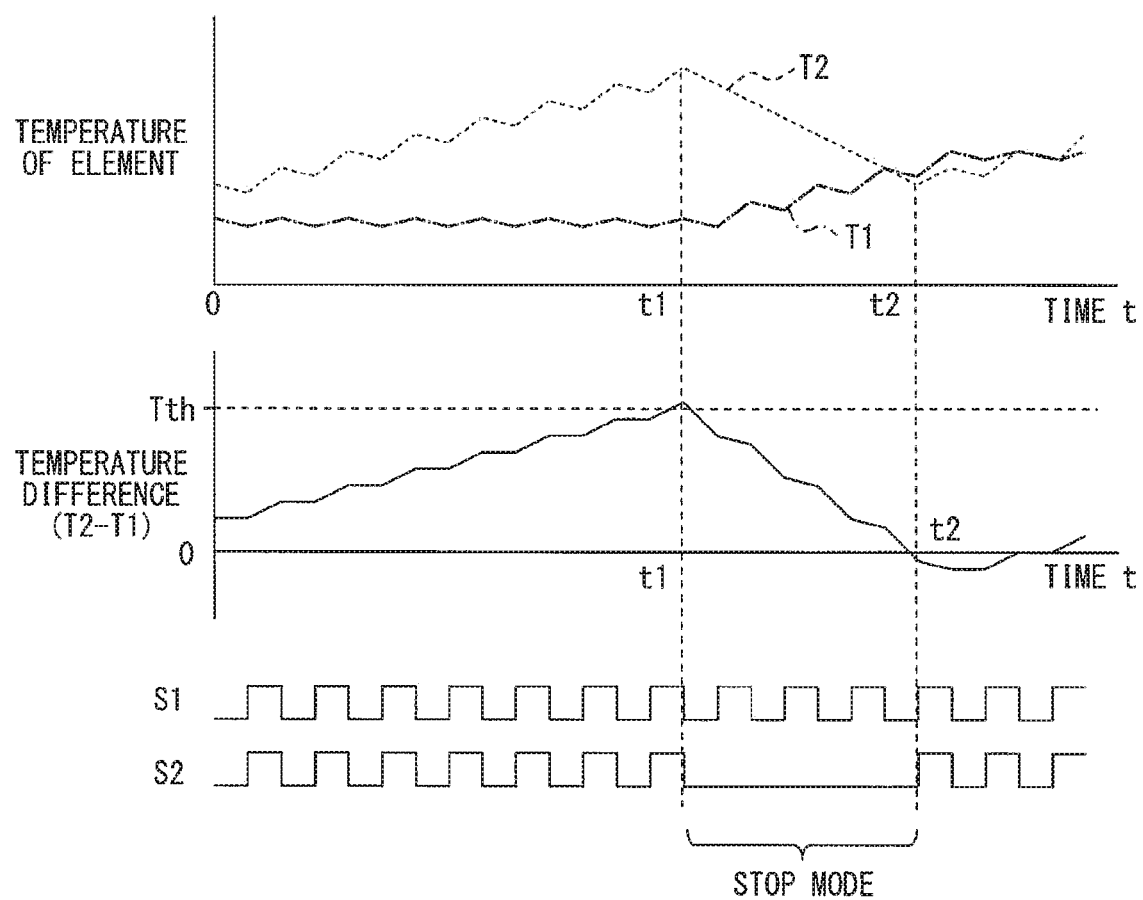
FIG. 4 is a timing chart showing a control of switching elements by a control unit.

As shown in FIG. 4, immediately before a time t1, the temperature difference $\Delta T$ (=|T2−T1|) becomes equal to or higher than the predetermined threshold temperature Tth. The threshold temperature Tth of the present embodiment is an allowable temperature difference between the elements in the semiconductor device 100. The control unit 30 shifts the operation mode from the normal mode to the stop mode in response to the temperature difference ΔT being equal to or higher than the threshold temperature Tth. More specifically, the control unit 30 shifts the operation mode to the stop mode at the time t1 at which the control signal falls from High to low after the temperature difference ΔT becomes equal to or higher than the threshold temperature Tth. At that time, the first element 11, which is lower than the second element 12 in temperature, continues to operate as it is. As shown in FIG. 4, in the stop mode, since the energization of the second element 12 stops, the temperature of the second element 12 gradually decreases. Since the total value of the currents flowing through the first element 11 and the second element 12 depends on a voltage of the power supply 400 and is kept substantially constant, the current supplied to the first element 11 increases as the second element 12 stops. For that reason, the temperature of the first element 11 gradually increases. In FIG. 4, S1 represents a control signal to the first element 11, and S2 represents a control signal to the second element 12.

As a result, as shown in FIG. 4, during a period of the stop mode, the temperature difference ΔT between the first element 11 and the second element 12 gradually approaches zero. When the temperature difference ΔT becomes zero immediately before a time t2, the control unit 30 returns the operation mode from the stop mode to the normal mode. More specifically, the control unit 30 shifts the operation mode to the normal mode at the time t2 at which the control signal rises from Low to High after the temperature difference ΔT becomes zero. As a result, the energization of the second element 12 whose energization has been stopped is started again.

In the present embodiment, as described above, the operation mode returns from the stop mode to the normal mode with ΔT=0. In the present embodiment, the zero degrees correspond to a return threshold. As will be described later, the return threshold does not necessarily have to be the zero degrees.

Next, advantageous effects achieved by the semiconductor device 100 according to the present embodiment will be described.

The semiconductor device 100 stops the driving of the high-temperature side switching element, which is higher than the other in temperature, when a predetermined temperature difference or more occurs between the multiple switching elements. This makes it possible to avoid such a phenomenon that only the temperature of any one of the multiple switching elements becomes prominently high, and reaches an upper limit. Therefore, it can be expected to maximize the output currents of all of the multiple switching elements.

In the semiconductor device 100, the temperature control is realized by a discrete current control such as energization and stoppage of the energization. Therefore, the circuit configuration of the control unit can be simplified as compared with the conventional configuration in which the current to be supplied to the semiconductor element is adjusted in an analog manner, that is, continuously. In other words, an increase in scale due to the complexity of the circuit can be suppressed.

The semiconductor device 100 stops the high-temperature side switching element when the temperature difference becomes equal to or greater than a predetermined threshold value. Therefore, the process involved in the feedback can be reduced as compared with the conventional configuration in which the adjustment is required even when only a slight temperature difference occurs.

Modification 1

In the embodiment described above, the return threshold temperature to return the operation mode from the stop mode to the normal mode is set to the zero degrees, as an example. However, the return threshold does not need to be the zero degrees, and may be set to the level lower than the threshold temperature which is the allowable temperature difference.

Figure 5:
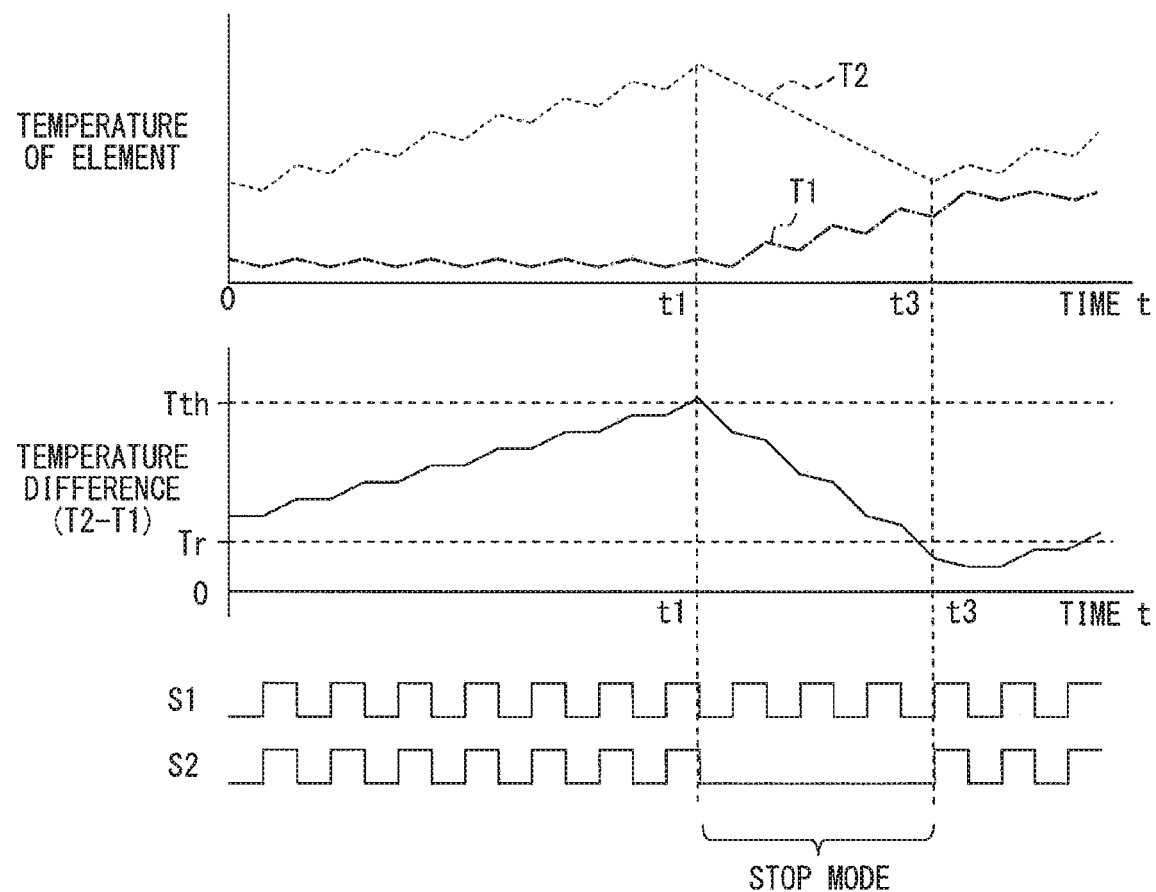
FIG. 5 is a timing chart showing a control of the switching elements by a control unit according to Modification 1.

For example, as shown in FIG. 5, the return threshold Tr may satisfy a condition of T2−T1>0. This example will be described in detail. After shifting to the stop mode at the time t1, the temperature T2 of the second element 12 decreases and the temperature T1 of the first element 11 increases. The control unit 30 shifts the operation mode to the normal mode at a time t3 at which the control signal rises from Low to High after the temperature difference T2−T1 between the first element 11 and the second element 12 decreases to a predetermined positive value. As a result, the energization of the second element 12 whose energization has been stopped is started again. In this example, the return threshold Tr is set as ΔT≠0, and is set to a value smaller than the threshold temperature Tth to shift to the stop mode. Specifically, the return threshold Tr is set so that a value obtained by subtracting the temperature of the switching element lower in temperature from the temperature of the switching element higher in temperature becomes a positive value. In other words, in this example, when the temperature of the switching element higher in temperature and the temperature of the switching element lower in temperature come closer to each other to some extent, the operation mode is returned from the stop mode to the normal mode.

Modification 2

Figure 6:
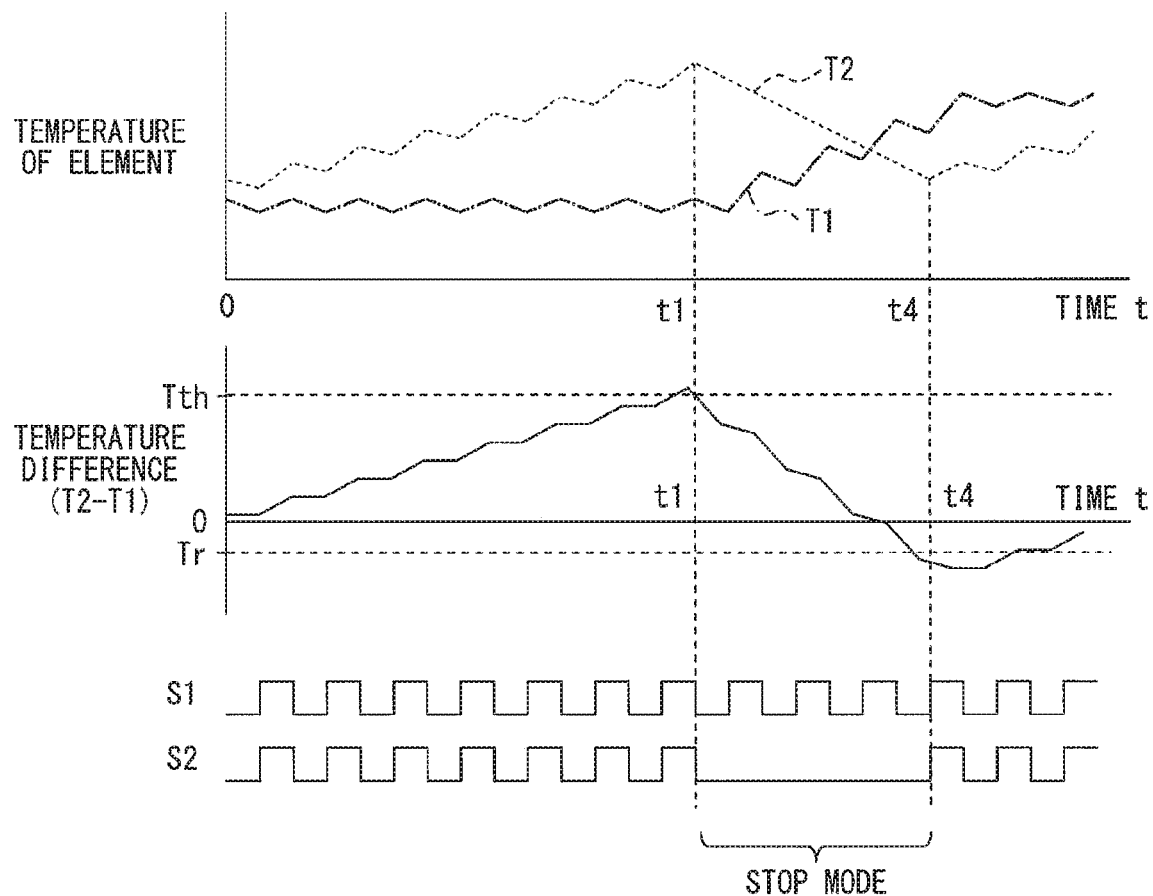
FIG. 6 is a timing chart showing a control of the switching elements by a control unit according to Modification 2.

In another example, as shown in FIG. 6, the return threshold Tr may satisfy a condition of T2−T1<0. This example will be described in detail. Similar to the first embodiment and Modification 1, after shifting to the stop mode at the time t1, the temperature T2 of the second element 12 decreases and the temperature T1 of the first element 11 increases. The control unit 30 shifts the operation mode to the normal mode at a time t4 at which the control signal rises from Low to High after the temperature difference T2−T1 between the first element 11 and the second element 12 decreases to a predetermined negative value. As a result, the energization of the second element 12 whose energization has been stopped is started again. In this example, the return threshold Tr is set as ΔT≠0, and is set to a value smaller than the threshold temperature Tth to shift to the stop mode. Specifically, the return threshold Tr is set so that a value obtained by subtracting the temperature of the switching element lower in temperature from the temperature of the switching element higher in temperature becomes a negative value. That is, in this example, the operation mode returns from the stop mode to the normal mode when the temperature of the switching element lower in temperature rises to a certain degree.

Second Embodiment

In the first embodiment and Modifications 1 and 2, the operation mode is exemplarily shifted from the normal mode to the stop mode with the use of one threshold temperature Tth. In the present embodiment, on the other hand, a description will be given of an example in which a semiconductor device 100 transitions the operation mode in stages. A hardware configuration is the same as that of the first embodiment, but a threshold temperature set inside a control unit 30 and a control of the switching elements 10 accompanying the threshold temperature are different from those of the first embodiment. Hereinafter, the above differences will be mainly described with reference to FIG. 7.

Figure 7:
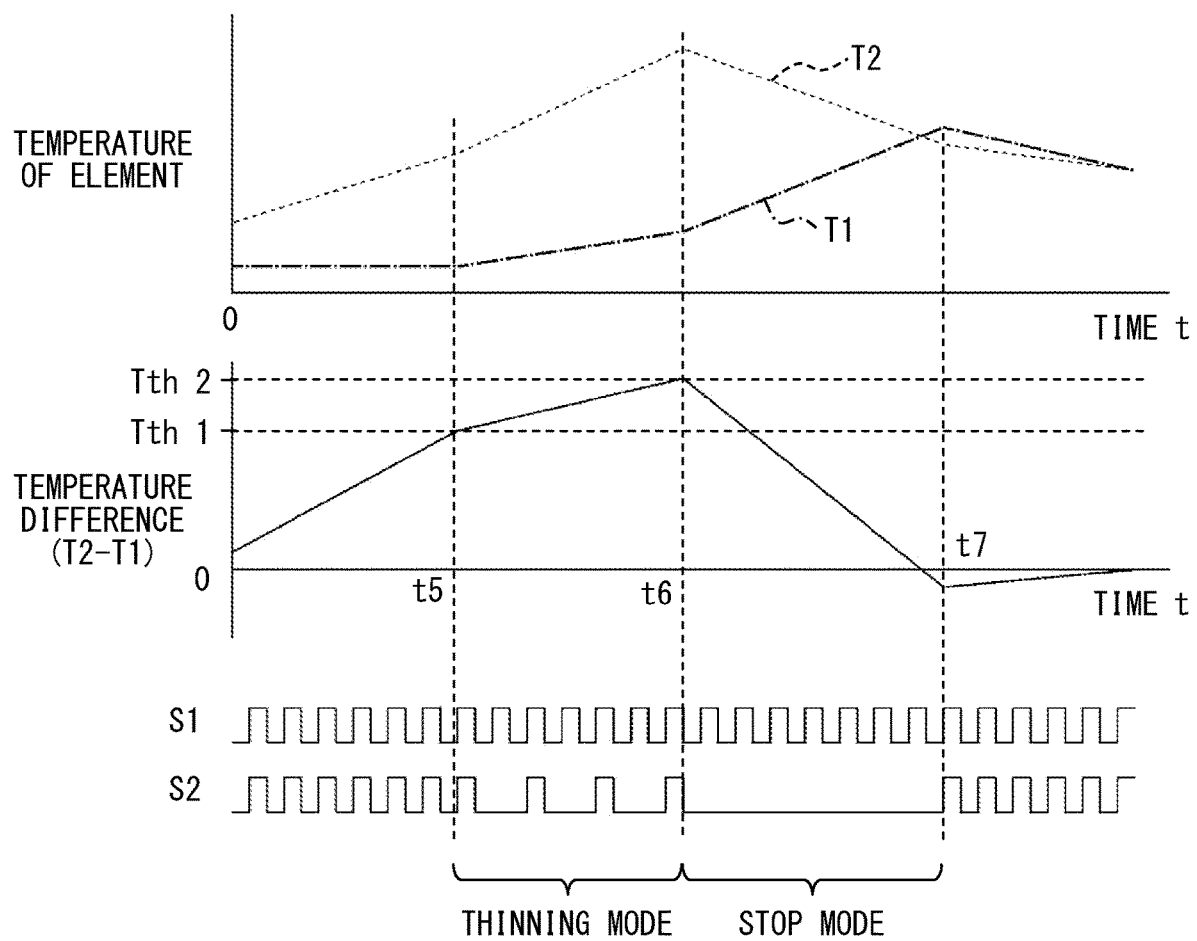
FIG. 7 is a timing chart showing a control of switching elements by a control unit according to a second embodiment.

As shown in FIG. 7, the control unit 30 sets a first threshold temperature Tth1 and a second threshold temperature Tth2 as the threshold temperature. In this example, the second threshold temperature Tth2 is a temperature for shifting the operation mode to a stop mode, and is synonymous with the threshold temperature in the first embodiment and Modifications 1 and 2.

The first threshold temperature Tth1 is set as a value lower than the second threshold temperature Tth2. In a period where a temperature difference ΔT between the first element 11 and the second element 12 is lower than the first threshold temperature Tth1, the control unit 30 operates the first element 11 and the second element 12 in a normal mode to energize both of the first element 11 and the second element 12.

Similarly to the first embodiment, when the temperature of the second element 12 rises and the temperature difference ΔT becomes equal to or larger than the first threshold temperature Tth1 at a time t5, the control unit 30 shifts the operation mode from the normal mode to a thinning mode. The thinning mode is an operation mode in which the number of pulses defining an ON period of the switching element is thinned out from the normal mode. Although a thinning rate can be arbitrarily set, in the thinning mode, as shown in FIG. 7, the control unit 30 according to the present embodiment thins out the number of pulses defining the ON period to be a half (by ½) in comparison with the normal mode.

FIG. 7 shows an example in which the temperature of the second element 12 continues to rise and the temperature difference ΔT increases even in the thinning mode. When the temperature difference ΔT becomes equal to or larger than the second threshold temperature Tth2 at a time t6, the control unit 30 shifts the operation mode from the thinning mode to the stop mode. The subsequent control is the same as that of the first embodiment, and therefore will not be described in detail, but the stop mode is released and returns to the normal mode at a time t7 at which the temperature difference ΔT becomes zero (or an arbitrary return threshold) as the current to be supplied to the second element 12 being stopped.

In the thinning mode, when the temperature difference ΔT between the second element 12 and the first element 11 decreases due to the temperature of the second element 12 being decreased with the decrease in the current supplied to the second element 12, the temperature difference ΔT may reach the return threshold during the thinning mode. In that case, the control unit 30 shifts the operation mode from the thinning mode to the normal mode when the temperature difference ΔT reaches the return threshold, and supplies the current to the first element 11 and the second element 12 as normal.

In the present embodiment, one first threshold temperature Tth1, which is a threshold temperature for shifting to the thinning mode, is exemplarily set as a set temperature smaller than the second threshold temperature Tth2, which is a threshold temperature for shifting to the stop mode. In this case, however, multiple threshold temperatures may be set. That is, the thinning rate may be changed in multiple stages until reaching the stop mode. In a period where the temperature difference ΔT is relatively small, the thinning rate may be set to a small rate, and as ΔT increases, the thinning rate may be increased. This makes it possible to seamlessly reduce the current to be supplied to the element higher in temperature, that is, the second element 12 in the present embodiment, while being discrete. In other words, the temperature difference ΔT can be controlled in more detail.

Third Embodiment

In the first embodiment and the second embodiment, as a trigger for returning the operation mode from the stop mode to the normal mode, the return threshold is exemplarily set with the temperature as an index. In the present embodiment, on the other hand, an operation mode is exemplarily returned from a stop mode to a normal mode with a duration of the stop mode as a trigger. A hardware configuration is the same as that of the first embodiment, and a control of switching elements 10 accompanying a return from the stop mode to the normal mode is different from that of the first embodiment. Hereinafter, the above difference will be mainly described with reference to FIG. 8.

Figure 8:
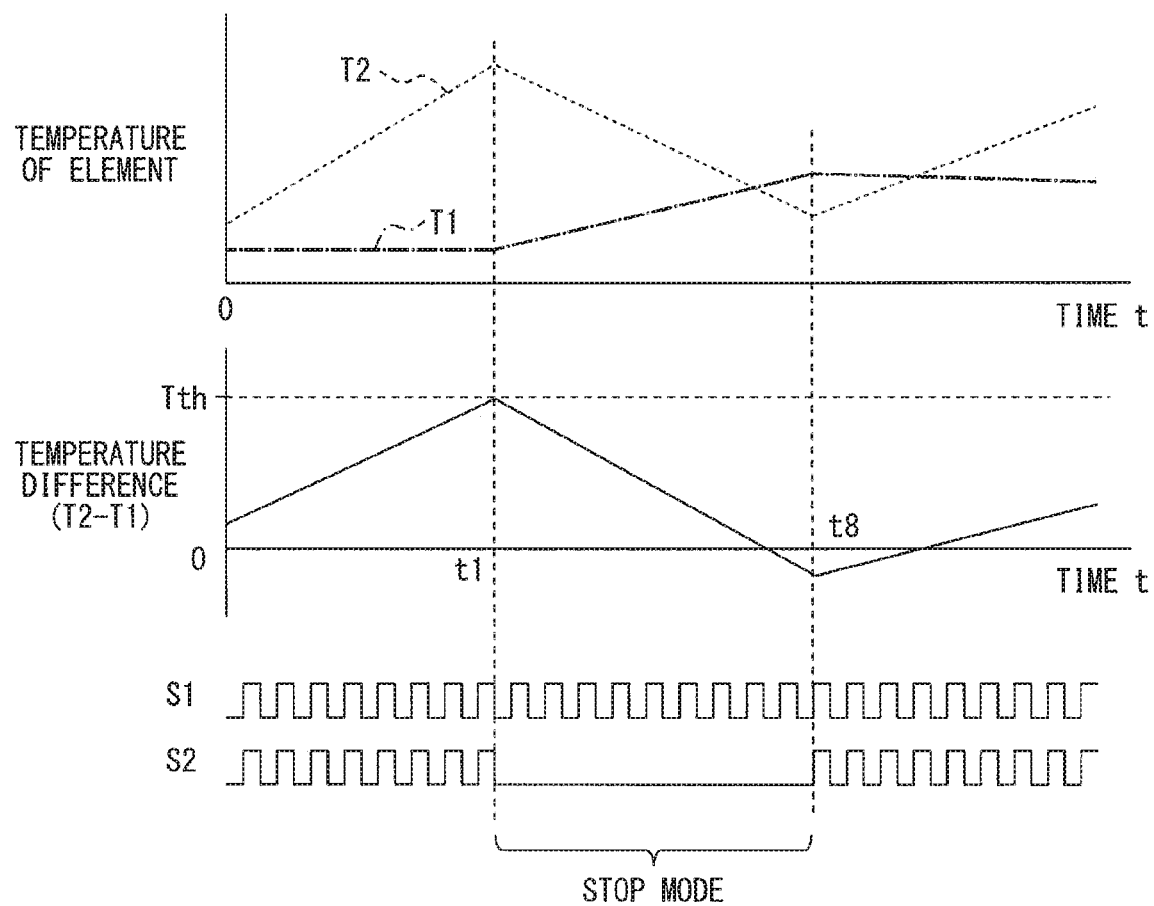
FIG. 8 is a timing chart showing a control of switching elements by a control unit according to a third embodiment.

As shown in FIG. 8, an example in which an element temperature of the second element 12 gradually rises in the normal mode will be described. Similar to the first embodiment, when a temperature difference ΔT between the first element 11 and the second element 12 becomes equal to or higher than a threshold temperature Tth, the operation mode shifts to the stop mode at a time t1. As a result, the current supplied to the second element 12 higher in temperature is stopped to lower the temperature T2 of the second element 12, and the amount of the current supplied to the first element 11 is increased to raise the temperature T1. After shifting to the stop mode, the control unit 30 measures the duration of the stop mode by a counter (not shown). After a predetermined period of time has elapsed, the operation mode shifts from the stop mode to the normal mode. As a result, the current is normally supplied to each of the first element 11 and the second element 12.

In the present embodiment, the number of pulses defining the ON period is used for measuring the time. More specifically, as shown in FIG. 8, a control signal S2 input to the second element 12 returns to the normal mode at a time t8 after nine pulses are stopped from the time t1. Since control signals S1 and S2 input to the first element 11 and the second element 12, respectively, are generated based on a clock of a master clock generator (quartz vibrator or the like) (not shown), the number of occurrences of pulses is correlated with time. It is needless to say that the duration of the stop mode is not limited to the duration corresponding to the nine pulses, and can be arbitrarily set.

As described above, in the mode of returning from the stop mode to the normal mode with the time as an index, there is no need to provide a return threshold unlike the first embodiment and the second embodiment, and there is no need to monitor a temperature involved in the return. As such, the circuit scale can be further reduced as compared with the mode having the return threshold to shift to the operation mode based on the return threshold. Alternatively, the processing involved in the return can be reduced.

Fourth Embodiment

In the first to third embodiments, the first temperature sensor 21 disposed in the vicinity of the first element 11 and the second temperature sensor 22 disposed in the vicinity of the second element 12 directly detect the temperatures of the corresponding elements, as an example. However, there are cases in which the first temperature sensor 21 and the second temperature sensor 22, which are direct temperature detection units, cannot be disposed in the vicinities of the corresponding elements due to a circumstance such as a lack of room in the implementation space. In such a case, a method of indirectly detecting the temperature of the switching elements 10 may be employed.

Figure 9:
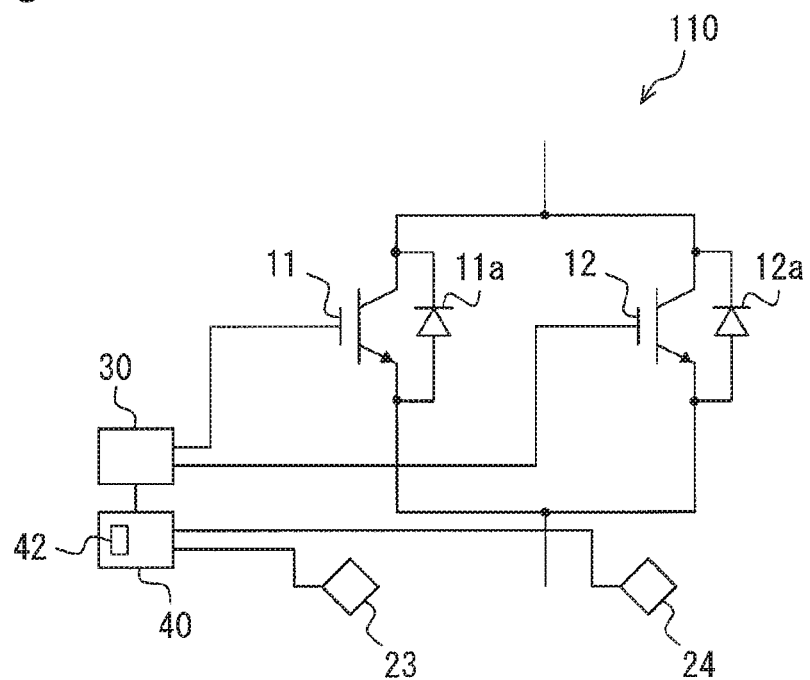
FIG. 9 is a block diagram showing a detailed configuration of a semiconductor device according to a fourth embodiment.

As shown in FIG. 9, a semiconductor device 110 according to the present embodiment includes a third temperature sensor 23 and a fourth temperature sensor 24. The third temperature sensor 23 and the fourth temperature sensor 24 are connected to an estimation unit 42 included in the temperature estimation unit 40. The semiconductor device 110 includes the third temperature sensor 23 in place of the first temperature sensor 21 in the first embodiment, the fourth temperature sensor 24 in place of the second temperature sensor 22, and the estimation unit 42 in place of the calculation unit 41, and the elements except for those elements are the same as those in the first embodiment.

The third temperature sensor 23 is disposed in a first lead frame (not shown) connecting to the first element 11. The first lead frame is a portion to which heat generated by the first element 11 is transferred to change the temperature, and the temperature of the first lead frame reflects the temperature of the first element 11. Similarly, the fourth temperature sensor 24 is disposed in a second lead frame (not shown) connecting to the second element 12. The second lead frame is a portion to which heat generated by the second element 12 is transferred to change the temperature, and the temperature of the second lead frame reflects the temperature of the second element 12. As described above, the temperatures of the lead frames detected by the third temperature sensor 23 and the fourth temperature sensor 24 depend on the temperatures of the first element 11 and the second element 12, respectively, and the third temperature sensor 23 and the fourth temperature sensor 24 indirectly detect the temperatures of the first element 11 and the second element 12, respectively. The third temperature sensor 23 and the fourth temperature sensor 24 correspond to an indirect temperature detection unit.

The estimation unit 42 corresponds to the calculation unit 41 of the first embodiment. The difference of the estimation unit 42 from the calculation unit 41 resides in that since the input temperature information is not a direct temperature of the switching elements 10, there is a control step of estimating the temperature of the switching elements 10 from the input temperature information. The estimation unit 42 has in advance correlation information between the temperature of the first element 11 and the temperature of the first lead frame, for example, for each peripheral environment. The estimation unit 42 estimates the temperature of the first element 11 with reference to the correlation information based on the detected temperature of the first lead frame and the conditions of the surrounding environment where the first element 11 is placed. The same is applied to the second element 12, and the estimation unit 42 estimates the temperature of the second element 12 with reference to the correlation information based on the detected temperature of the second lead frame and the conditions of the surrounding environment where the second element 12 is placed.

The control unit 30 calculates a temperature difference ΔT with the use of the temperatures of the first element 11 and the second element 12 estimated by the estimation unit 42, and switches the operation mode by the similar control to those in the first to third embodiments.

As described above, even when the temperatures of the switching elements 10 cannot be directly detected, the semiconductor device 110 according to the present embodiment can estimate the temperatures of the switching elements 10 with the use of the indirect temperature detection unit, and calculate, for example, the temperature difference ΔT between the first element 11 and the second element 12 based on the estimation value. In other words, even when the temperatures of the switching elements 10 cannot be directly detected, the semiconductor device 110 can control the energization of each switching element 10 so as to correct the temperature difference between the multiple switching elements 10.

Modification 3

In the fourth embodiment described above, the lead frames are exemplified as an element that reflects the temperatures of the switching elements 10. However, the element is not limited to the lead frame.

Figure 3:
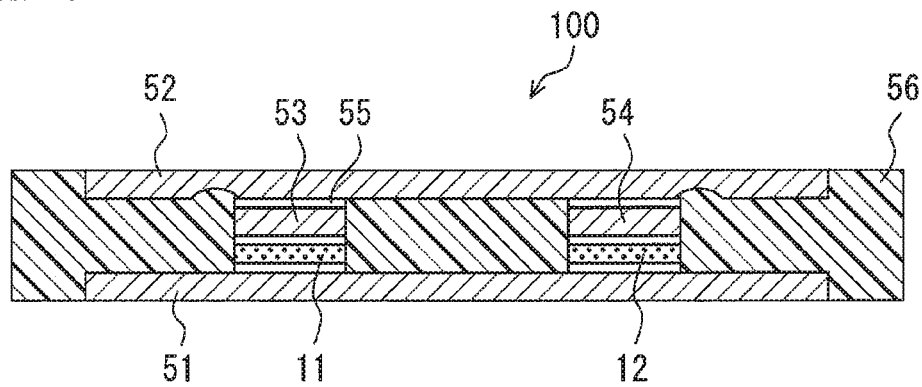
FIG. 3 is a cross-sectional view showing a mounting structure of the semiconductor device.

For example, it is assumed that heat sinks are formed on the metal bodies 51 and 52 shown in FIG. 3. More specifically, it is assumed that a first heat sink is formed in the vicinity of the first element 11 and a second heat sink is formed in the vicinity of the second element 12 on one surface of the metal body 51 exposed from the resin 56. In the configuration described above, the first heat sink reflects the temperature of the first element 11 and the second heat sink reflects the temperature of the second element 12. When the third temperature sensor 23 is disposed in the first heat sink, the temperature of the first element 11 can be indirectly detected by the third temperature sensor 23, and when the fourth temperature sensor 24 is disposed in the second heat sink, the temperature of the second element 12 can be indirectly detected by the fourth temperature sensor 24.

Even in the configuration described above, the estimation unit 42 has in advance correlation information between the temperature of the first element 11 and the temperature of the first heat sink, for example, for each peripheral environment. The estimation unit 42 estimates the temperature of the first element 11 with reference to the correlation information based on the detected temperature of the first heat sink and the conditions of the surrounding environment where the first element 11 is placed. The same is applied to the second element 12, and the estimation unit 42 estimates the temperature of the second element 12 with reference to the correlation information on the second element 12 based on the detected temperature of the second heat sink and the conditions of the surrounding environment where the second element 12 is placed.

In another example, it is assumed that the switching elements 10 are cooled by water cooling. Specifically, it is assumed that a first water cooling path for cooling the first element 11 is provided in the vicinity of the first element 11, and a second water cooling path for cooling the second element 12 is provided in the vicinity of the second element 12. In such a configuration, refrigerant (for example, water) flowing through the first cooling path reflects the temperature of the first element 11, and refrigerant flowing through the second cooling path reflects the temperature of the second element 12. When the third temperature sensor 23 is disposed on the first cooling path, the temperature of the first element 11 can be indirectly detected by the third temperature sensor 23, and when the fourth temperature sensor 24 is disposed on the second cooling path, the temperature of the second element 12 can be indirectly detected by the fourth temperature sensor 24.

Even in the configuration described above, the estimation unit 42 has in advance the correlation information between the temperature of the first element 11 and the temperature of the refrigerant flowing through the first cooling path, for example, for each surrounding environment. The estimation unit 42 estimates the temperature of the first element 11 with reference to the correlation information based on the detected temperature of the refrigerant flowing through the first cooling path and the conditions of the surrounding environment where the first element 11 is placed. The same is applied to the second element 12, and the estimation unit 42 estimates the temperature of the second element 12 with reference to the correlation information on the second element 12 based on the detected temperature of the refrigerant flowing through the second cooling path and the conditions of the surrounding environment where the second element is placed.

Modification 4

In the fourth embodiment and Modification 3, the temperature sensor is exemplarily used as the indirect temperature detection unit. However, the temperatures of the first element 11 and the second element 12 may be estimated based on a physical quantity other than the temperature.

Figure 10:
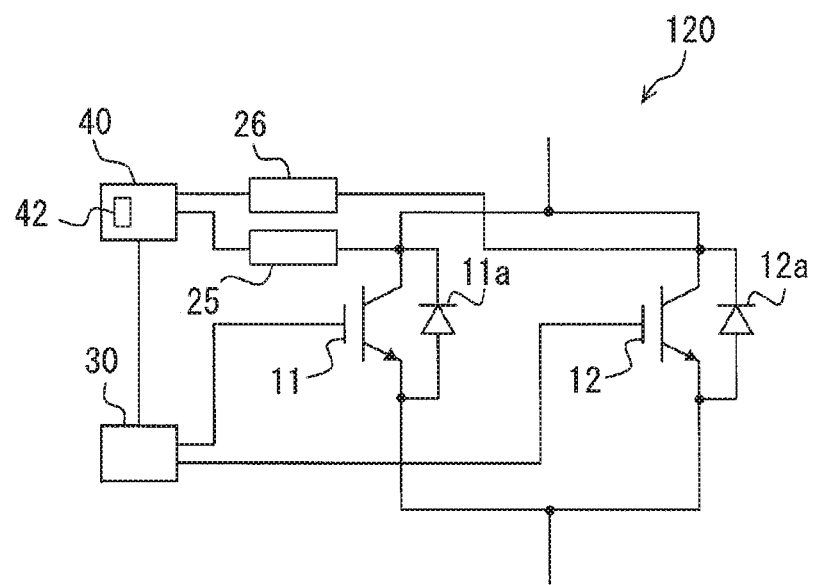
FIG. 10 is a block diagram showing a detailed configuration of a semiconductor device according to Modification 4.

Modification 4 will be described in detail. As shown in FIG. 10, a semiconductor device 120 according to the present modification includes a first current sensor 25 and a second current sensor 26. The first current sensor 25 and the second current sensor 26 are connected to an estimation unit 42.

The first current sensor 25 detects a current flowing through a first element 11, that is, an output current of the first element 11. The second current sensor 26 detects a current flowing through a second element 12, that is, an output current of the second element 12. A sum total of the output current of the first element 11 and the output current of the second element 12 is a constant value defined by an output voltage of a power supply 400 and on-resistances of the elements 11 and 12. However, a breakdown of the current flowing through the first element 11 and the current flowing through the second element 12 depends on the on-resistances in the normal mode. Since the on-resistance depends on a manufacturing variation and a temperature of each switching element 10, if the manufacturing variation of the on-resistance has been known, a temperature of the first element 11, a temperature of the second element 12, or a temperature difference ΔT between the first element 11 and the second element 12 can be estimated.

The estimation unit 42 has in advance information on the manufacturing variations of the corresponding switching elements 10, that is, the first element 11 and the second element 12, and information on the temperature dependences of the on-resistances thereof. The estimation unit 42 estimates the temperature difference ΔT based on the output current of the first element 11 and the output current of the second element 12.

As described above, similarly to the fourth embodiment and Modifications 3 and 4, the temperatures or the temperature difference of the switching elements 10 can be estimated with the use of an element reflecting the temperatures of the switching elements 10, and the control unit 30 can control the currents to be supplied to the switching elements 10 based on the estimation value. The element that reflects the temperatures of the switching elements 10, is not limited to the example described above, but any element can be employed.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

In each of the embodiments and modifications described above, the type of the switching elements 10 is the IGBT, for example. However, the type of the switching elements 10 is not limited to the IGBT. Also, the types of elements electrically connected in parallel with each other may be different from each other. For example, the first element 11 may be an IGBT, and the second element 12 may be a MOS transistor. Needless to say, the reverse may be adoptable.

What is claimed is:
1. A semiconductor device comprising:
a plurality of switching elements that are electrically connected in parallel with each other;
a control unit that is configured to output a control signal for controlling a current supplied to each of the plurality of switching elements; and
a temperature estimation unit that is configured to estimate a temperature difference between the plurality of switching elements, wherein
the control unit shifts an operation mode to a stop mode to stop driving of at least one of the plurality of switching elements, which has a temperature higher than the other, in response to the estimated temperature difference being equal to or higher than a predetermined threshold temperature,
the control signal indicates an ON period and an OFF period of voltage application repetitively in a predetermined cycle,
the control unit shifts the operation mode to a thinning mode by outputting the control signal in which the ON period is thinned to the at least one of the plurality of switching elements having the temperature higher than the other, in response to the estimated temperature difference being equal to or higher than a first threshold temperature, and
the control unit shifts the operation mode to the stop mode by outputting the control signal having only the OFF period to the at least one of the plurality of switching elements having the temperature higher than the other, in response to the estimated temperature difference being equal to or higher than a second threshold temperature higher than the first threshold temperature.

2. The semiconductor device according to claim 1, wherein
the control unit cancels the stop mode in response to the temperature difference being equal to or less than a predetermined return threshold, and drives the plurality of switching elements normally.

3. The semiconductor device according to claim 1, wherein the control unit cancels the stop mode in response to a predetermined time period having elapsed after shifting to the stop mode, and drives the plurality of switching elements normally.

4. The semiconductor device according to claim 1, wherein
the temperature estimation unit includes a direct temperature detection unit that directly detects a temperature of each of the plurality of switching elements, and a calculation unit that calculates the temperature difference based on the detected temperatures.

5. The semiconductor device according to claim 1, wherein
the temperature estimation unit includes an indirect temperature detection unit that indirectly detects a temperature of each of the plurality of switching elements, and an estimation unit that estimates the temperature difference based on the detected temperatures.

6. The semiconductor device according to claim 5, wherein
the indirect temperature detection unit detects a temperature of a lead frame reflecting the temperature of each of the plurality of switching elements, and
the estimation unit estimates the temperature difference based on the temperature of the lead frame.

7. The semiconductor device according to claim 5, wherein
the indirect temperature detection unit detects a temperature of a heat sink reflecting the temperature of each of the plurality of switching elements, and
the estimation unit estimates the temperature difference based on the temperature of the heat sink.

8. The semiconductor device according to claim 5, wherein
the indirect temperature detection unit detects a temperature of a refrigerant reflecting the temperature of each of the plurality of switching elements, and
the estimation unit estimates the temperature difference based on the temperature of the refrigerant.

9. The semiconductor device according to claim 5, wherein
the indirect temperature detection unit detects the current supplied to each of the plurality of switching elements, and
the estimation unit estimates the temperature difference based on the detected current.

10. The semiconductor device according to claim 1, wherein
the plurality of switching elements connected in parallel are different in type from each other.

11. The semiconductor device according to claim 10, wherein
the plurality of switching elements connected in parallel include an insulated gate bipolar transistor and a MOS transistor.

12. The semiconductor device according to claim 1, wherein
the plurality of switching elements connected in parallel are held between a pair of metal bodies, and
the plurality of switching elements and the metal bodies are sealed integrally with a resin, and one surface of each of the metal bodies is exposed from the resin.

13. The semiconductor device according to claim 1, wherein
the plurality of switching elements at least includes a first switching element and a second switching element,
the temperature estimation unit estimates a temperature difference between the first switching element and the second switching element as the temperature difference, and
the control unit shifts the operation mode to the stop mode for stopping the driving of one of the first switching element and the second switching element, which is higher in temperature, in response to the estimated temperature difference being equal to or higher than the predetermined threshold temperature.

* * * * *